(12) United States Patent
Zhou et al.

(10) Patent No.: US 10,276,815 B2
(45) Date of Patent: Apr. 30, 2019

(54) ORGANIC FIELD-EFFECT-TRANSISTORS WITH LOW CONTACT RESISTANCE

(71) Applicants: BASF SE, Ludwigshafen (DE);
National University of Singapore, Singapore (SG)

(72) Inventors: Mi Zhou, Seobu-ro (KR); Peter K.-H. Ho, Singapore (SG); Lay-Lay Chua, Singapore (SG); Png Rui-Qi, Singapore (SG); Wei-Ling Seah, Singapore (SG)

(73) Assignees: BASF SE, Ludwigshafen (DE);
National University of Singapore, Singapore (SG)

(*) Notice: Subject to any disclaimer, the term of this patent is extended or adjusted under 35 U.S.C. 154(b) by 0 days.

(21) Appl. No.: 15/545,776

(22) PCT Filed: Feb. 1, 2016

(86) PCT No.: PCT/EP2016/052049
§ 371 (c)(1),
(2) Date: Jul. 24, 2017

(87) PCT Pub. No.: WO2016/124533
PCT Pub. Date: Aug. 11, 2016

(65) Prior Publication Data
US 2018/0026215 A1     Jan. 25, 2018

(30) Foreign Application Priority Data

Feb. 4, 2015 (EP) .................................. 15153767

(51) Int. Cl.
*H01L 51/05* (2006.01)
*H01L 51/00* (2006.01)
*H01L 51/10* (2006.01)

(52) U.S. Cl.
CPC .......... *H01L 51/105* (2013.01); *H01L 51/002* (2013.01); *H01L 51/004* (2013.01);
(Continued)

(58) Field of Classification Search
None
See application file for complete search history.

(56) References Cited

U.S. PATENT DOCUMENTS 6,806,124 B2   10/2004   Klauk et al.
7,208,756 B2    4/2007   Shih et al.
(Continued)

OTHER PUBLICATIONS

Casalini, S., et al. "Hydrophilic Self-Assembly Monolayers for Pentacene-Based Thin-Film Transistors." Organic Electronics, vol. 14, No. 7, 2013, pp. 1891-1897., doi:10.1016/j.orgel.2013.03.034.*
(Continued)

*Primary Examiner* — Joseph Schoenholtz
(74) *Attorney, Agent, or Firm* — Oblon, McClelland, Maier & Neustadt, L.L.P.

(57) ABSTRACT

This invention provides a transistor device structure that incorporates a self-aligned doped contact formed by inserting a molecularly-thin layer of bonded anions between the semiconductor and the source-drain electrode array wherein the semiconductor is p-doped at the interface with the bonded-anion layer, and a method of making this structure using oxidant species incorporated into the molecularly-thin layer. The device shows ohmic hole injection and hole extraction at the contacts to give high-performance transistor characteristics with low contact resistance.

14 Claims, 5 Drawing Sheets

(52) U.S. Cl.
CPC ........ *H01L 51/009* (2013.01); *H01L 51/0037* (2013.01); *H01L 51/0036* (2013.01); *H01L 51/0043* (2013.01); *H01L 51/0541* (2013.01); *H01L 51/0545* (2013.01); *H01L 51/0558* (2013.01)

(56) References Cited

U.S. PATENT DOCUMENTS

| 8,569,746 | B2 | 10/2013 | Nagamatsu et al. | |
| 9,299,941 | B2* | 3/2016 | Lee | H01L 51/105 |
| 2007/0085061 | A1* | 4/2007 | Elder | C09D 165/00 252/500 |
| 2012/0181519 | A1* | 7/2012 | Lee | H01L 51/105 257/40 |
| 2012/0199822 | A1* | 8/2012 | Kamura | H01L 51/105 257/40 |

OTHER PUBLICATIONS

Broder, Tessa L., et al. "Electrochemical Oxidation of Nitrite and the Oxidation and Reduction of NO2 in the Room Temperature Ionic Liquid [C2mim][NTf2]." The Journal of Physical Chemistry B, vol. 111, No. 27, 2007, pp. 7778-7785., doi:10.1021/jp0728104.*

Lee, K. Y., et al. "Redox Equilibria of the Nitrosonium Cation and of Its Nonbonded Complexes." Inorganic Chemistry, vol. 29, No. 21, 1990, pp. 4196-4204., doi:10.1021/ic00346a008.*

Lee, Jiyoul, et al. "Ionic Self-Assembled Monolayer for Low Contact Resistance in Inkjet-Printed Coplanar Structure Organic Thin-Film Transistors." Organic Electronics, vol. 15, No. 9, 2014, pp. 2021-2026., doi:10.1016/j.orgel.2014.05.019.*

International Search Report and Written Opinion dated Apr. 12, 2016 in PCT/EP2016/52049.

S. Casalini, et al., "Hydrophilic Self-Assembly Monolayers for Pentacene-Based Thin-Film Transistors", Organic Electronics, vol. 14 No. 7, Apr. 2013, XP028554603, pp. 1891-1897.

Fang-Chung Chen, et al., "Copper Phthalocyanine Buffer Layer to Enhance the Charge Injection in Organic Thin-Film Transistors", Applied Physics Letters, vol. 90, 2007, pp. 073504 (1-3) (with cover pages).

Haiyang Gui, et al., "Inserting a Mn-doped $TiO_2$ layer for improving performance of pentacene organic thin-film transistors", Organic Electronics, vol. 15 No. 11, Sep. 2014, pp. 3349-335.

Kipyo Hong, et al., "Reducing the contact Resistance in Organic Thin-Film Transistors by Introducing a PEDOT:PSS Hole-Injection Layer", Organic Electronics, vol. 9, 2008, pp. 864-86.

Daisuke Kumaki, et al., "Reducing the Contact Resistance of Bottom-Contact Pentacene Thin Film Transistors by Employing a $MoO_x$ Carrier Injection Layer", Applied Physics Letters, vol. 92, 2008, pp. 013301 (1-3).

Jun Li, et al., "Tuning the Contact Resistance in Organic Thin-Film Transistors With an Organic—Inorganic Hybrid Interlayer", Superlattices and Microstructures, vol. 50 No. 2,2011, pp. 191-197.

Shun-Kean Lin, et al., "Low Electrode Contact Resistance in Pentacene-Based Thin-Film Transistors by Inserting F4-TCNQ between Pentacene and Au", ECS Solid State Letters, May 2014, vol. 3 No. 7, pp. 81-83.

Takeo Minari, et al., "Highly Enhanced Charge Injection in Thienoacene-Based Organic Field-Effect Transistors with Chemically Doped Contact", Applied Physics Letters, vol. 100 No. 9, 2012, pp. 093303 (1-4).

S. Young Park, et al., "Introduction of an Interlayer Between Metal and Semiconductor for Organic Thin-Film Transistors", Applied Physics Letters, vol. 88, Mar. 2006, pp. 113503 (1-3) (with cover pages).

Stefan Schaur, et al., "Electrochemical doping for lowering contact barriers in organic field effect transistors", Organic Electronics, vol. 13, Apr. 2012, pp. 1296-1301.

Claudio Vanoni, et al., "Reduction of the contact resistance by doping in pentacene few monolayers thin film transistors and self-assembled nanocrystals", Applied Physics Letters, vol. 90 No. 19, May 2007, pp. 193119 (1-3) (with cover pages).

Jiyoul Lee, et al. "Ionic self-assembled monolayer for low contact resistance in inkjet-printed coplanar structure organic thin-film transistors", Organic Electronics, vol. 15, issue 9, 2014, pp. 2021-2026.

* cited by examiner

ORGANIC FIELD-EFFECT-TRANSISTORS WITH LOW CONTACT RESISTANCE

This invention relates to a structure for field-effect transistors with low contact resistance, and a method of making this structure.

The performance of organic field-effect transistors (FETs) has improved tremendously over the past decade as a result of the development of new materials with higher charge-carrier mobilities and higher purities. FETs comprise a pair of source-drain electrodes separated by a semiconductor film made of an organic material (U.S. Pat. No. 8,569,746 B2). The film is gated by the gate electrode through an intervening gate dielectric layer. Application of an appropriate gate polarity and voltage causes the accumulation of carriers at the semiconductor-dielectric interface to give the conduction channel.

Two important classes of device configurations can be distinguished: the so-called top-gate bottom-contact, and bottom-gate top-contact FETs, depending on the relative placements of the gate electrode and the source-drain electrodes. The junction between the semiconductor and the source-drain electrodes through which charge is injected or collected is also called the "contacts". In principle, two other configurations are possible, the top-gate top-contact and bottom-gate bottom-contact FETs, but these typically suffer from more severe current-crowding effects at the junction between the contacts and the conduction channel and are therefore of limited applications in technology.

The total electrical resistance through the FET is given by the sum of the resistances of the channel ($R_{ch}$) and of the contacts ($R_c$):

$$R_{tot} = R_{ch} + R_c \qquad \text{Eqn 1.}$$

The $R_{ch}$ is determined by the two-dimensional carrier density accumulated at the semiconductor-dielectric interface. This depends on the gate field and is given in first approximation by:

$$R_{ch} = \frac{V_{ds}}{I_{ds}} = \left[ \frac{1}{\mu_{FET} CW} \frac{1}{V_{gs} - V_{th} - \frac{1}{2}V_{ds}} \right] \cdot L \qquad \text{Eqn 2}$$

where $V_{ds}$ is the source-drain voltage, $V_{gs}$ is the gate voltage, $V_{th}$ is the gate threshold, $I_{ds}$ is the source-drain current, $\mu_{FET}$ is the field-effect transistor mobility, C is the gate dielectric capacitance, and L and W are the channel length and width respectively.

The contact resistance $R_c$ on the other hand is the effective electrical resistance encountered by the charge carriers as they travel from the source electrode to the channel, and from the channel to the drain electrode. This $R_c$ is the sum of the space-charge resistance $R_{SCLC}$ that arises from the bulk voltage required to draw the requisite source-drain current through a semiconductor region between the electrode and the channel, and the effective electrode contact resistance $R_e$ of the contacts:

$$R_c = R_{SCLC} + R_e \qquad \text{Eqn 3.}$$

$R_e$ is given by the product of an effective electrode contact resistivity $r_e$ and the effective contact area $A_e$. The distinction between $R_c$ and $R_e$ is often not made in the literature. However it is important to do so presently. $R_e$ depends primarily on the electrode-semiconductor contact and details of the device geometry. $R_{SCLC}$ depends primarily on the space-charge mobility of the carriers in the bulk of the film, the distance from the electrode to the channel, and any current-crowding effects present.

This invention aims to reduce $r_e$ and hence $R_e$. The $r_e$ is expected to depend on the electrode used (e.g., gold, silver, copper or others) and if an overlayer is present, and the energy of the semiconductor transport level (e.g. highest occupied molecular orbital (HOMO) band edge for holes, and lowest occupied molecular orbital (LUMO) band edge for electrons) in relation to the Fermi level of the electrode.

A state of ohmic contact is said to be achieved when $R_e$ is far smaller than $R_{ch}$, preferably smaller than one-tenth of $R_{ch}$, and more preferably smaller than one-thirtieth of $R_{ch}$.

For an organic semiconductor material with a field-effect mobility of the order of 0.5 cm$^2$ V$^{-1}$ s$^{-1}$, the $R_{ch}$ for a device channel length of 100 µm is 300 kΩ cm in the "on" state. This means the total $R_c$ for both source and drain contacts has to be kept less than one-tenth of this, i.e., less than 30 kΩ cm, in order for the contacts to not severely limit performance of the transistors, including speed, bandwidth and turn-on characteristics. This is very demanding and not readily achievable in the prior art.

The currently attainable $R_c$ for top-gate bottom-contact FETs with gold source-drain electrodes has been found to be 10$^5$-10$^6$ Ω cm for a wide range of organic semiconductors including pentacene (Pn) and 6,13-bis(triisopropylsilylethynyl)pentacene (TIPS-Pn), as described in D. Boudinet et al., Organic Electronics, 11, 227 (2010); and poly[2,5-bis(3-tetradecylthiophen-2-yl)thieno[3,2-b]thiophene] (PBTTT), as described in Y. Y. Noh et al., Semiconductor Science and Technology, 26, 034003 (2011). All these organic semiconductors have relatively low ionization potential ($I_p$): PBTTT, 4.8 eV; both Pn and TIPS-Pn, 4.9 eV. Thus $R_c$ is not sufficiently low even for devices with relatively long channel lengths and for semiconductors with relatively low $I_p$ which may be expected to give ohmic behavior most readily. This is further exacerbated as the field-effect mobility becomes larger and/or the channel length becomes shorter: the tolerable $R_c$ becomes proportionally smaller.

It is widely known that the typical metals used as hole-carrier injecting electrodes in organic FET technologies, for example, gold, silver and copper, do not have a large enough work function to achieve ohmic contacts with organic semiconductors having an $I_p$ larger than about 5.0 eV. This unfortunately covers most of the materials of present and future technological interest as p-channel materials.

The key to reducing $r_e$ and hence $R_e$ is to lower the effective charge-injection barrier into the semiconductor. Several approaches have been attempted to achieve this for p-channel FETs.

One approach is to increase the work function of the source-drain electrode by modification of its surface to increase its workfunction. One method to modify a metal electrode surface to do so is the use of so-called self-assembled monolayers (SAMs). Campbell et al in Physical Review B, 54 (2008) pp. 14321 demonstrated that thiol SAMs can cause large workfunction changes through a dipolar mechanism when assembled on a silver surface.

One example of its application to FETs is given by Asadi et al in Journal of Materials Chemistry, 17 (2007) pp. 1947, where 1H, 1H, 2H, 2H-perfluorodecanethiol and hexadecanethiol SAMs were reported to increase the workfunction of gold to 5.6 eV, and decrease it to 4.0 eV respectively. However the FET devices showed an increase in $R_c$ from 1 MΩ cm to 4 and 7 MΩ cm respectively for an orange-emitting poly(p-phenylenevinylene) as the semiconductor, and an increase from 80 kΩ cm to 100 kΩ cm for regioregular poly(3-hexylthiophene) as the semiconductor.

Another example is given by Noh et al in Semiconductor Science Technology, 26 (2011) pp. 034003, where 1H, 1H, 2H, 2H-perfluorodecanethiol SAM was reported to increase the workfunction of Au from about 4.4 eV to 5.0 eV. The $R_c$ was found to decrease slightly from 150 kΩ cm to 90 kΩ cm for PBTTT as the semiconductor.

In some cases, the SAM appears to promote a more desirable organization and/or orientation of the frontier layers of the organic semiconductor that favors carrier injection. Kawasaki et al. in Japanese Journal of Applied Physics, 47 (2008) pp. 6247 describes the use of a hydrophobic thiol-terminated SAM to improve the orientation and morphology of an evaporated Pn semiconductor.

Therefore while it is clear that some SAMs are able to increase the workfunction of metal surfaces, they do not in general reduce $R_c$ significantly, possibly as a result of the additional tunneling barrier introduced. Furthermore, fluorinated SAMs create new challenges for wetting and solution deposition of the semiconductor overlayer. Finally thiol SAMs in particular have limited thermal and chemical stabilities on metal surfaces.

A second method to modify the metal electrode surface to increase its workfunction is the use of p-doped conducting polymers with a high workfunction. One example is given by Hong et al in Organic Electronics, 9 (2008) pp. 864, where a thick p-doped conducting polymer hole-injection layer, poly(3,4,-ethylene dioxy-thiophene):poly(styrene sulfonic) acid (PEDT:PSSH) was spin-cast over a gold source-drain electrode array. This made use of spontaneous dewetting of the solution over the hydrophobic channel region to pattern the conducting-polymer film. They found $R_c$ decreased from 3 MΩ cm to 140 kΩ cm for Pn as the semiconductor.

This method relies very much on the differential wetting-dewetting of a thick conducting-polymer film over the electrode and channel regions of the substrate. It is very challenging to implement on devices with small channel lengths unless several additional lithography steps are introduced. Furthermore it may only provide good hole contact only for semiconductors with $I_p$ less than the workfunction of the conducting polymer layer which limits the application of this method even if good lithography processes can be found to pattern the conducting-polymer film aligned to the source-drain electrode array.

A third method to modify the metal electrode surface to increase its workfunction is to form a suitable oxide layer over its surface. One example is given by Kim et al, in Journal of Applied Physics, 84 (1998) pp. 6859, which reported the increase in workfunction of ITO from 4.5 eV to 4.75 eV $O_2$ plasma.

A fourth method to modify the metal electrode surface to increase its workfunction is the use of semiconducting inorganic oxides with a high workfunction. One example is given by Kumaki et al in Applied Physics Letters, 92 (2008) pp. 013301, where a $MoO_x$ layer followed by gold overlayer is evaporated in a photoresist-patterned well on a $SiO_2$/Si substrate, followed by deposition of Pn organic semiconductor to give bottom-gate bottom-channel FETs. The $R_c$ was reported to decrease from 13 MΩ cm to 240 kΩ cm when the $MoO_x$ layer was used.

Another example is given by Gui et al in Organic Electronics, 15 (2014) pp. 3349, where a $TiO_2$ or Mn-doped $TiO_2$ layer was thermally evaporated onto a Pn organic semiconductor layer (channel) through a metal mask followed by the gold source-drain array. The $R_c$ of the FET was reported to decrease from 2 MΩ cm to 40 kΩ cm and 30 kΩ cm respectively when the $TiO_2$ and Mn-doped $TiO_2$ was used.

This method requires sequential evaporation runs to define the source-drain electrodes through a shadow or lithography/photoresist mask. If the electrodes were to be deposited by plating or printing techniques, this method would require additional lithography steps for the alignment.

A second approach is to introduce intermediate semiconductor layers to reduce the overall barrier for injection into the organic semiconductor. This approach, also called the graded injection approach, was described by Ho et al in Nature, 404 (2000) pp. 481. An application to organic FETs is given by Park et al in Applied Physics Letters, 88 (2006) pp. 113503, where a thin film of star-burst amine 4,4',4"-tris(N-3-methylphenyl-N-phenylamino)-triphenylamine (m-MTDATA) was inserted between the Pn semiconductor and the gold electrode in top-contact devices to create intermediate energy levels between the gold Fermi level and the HOMO edge of Pn. This reduced $R_c$ from 8 MΩ cm to 1 MΩ cm.

Another example is given by Chen et al in Applied Physics Letters, 90 (2007) pp. 073504, where a layer of copper phthalocyanine (CuPc) is inserted between Pn and the evaporated gold electrode in top-contact devices to create an intermediate energy level between the gold Fermi level and the HOMO of Pn. This reduced $R_c$ from 470 kΩ cm to 155 kΩ cm.

Hence it is clear that while the $R_c$ can be significantly improved using the graded-injection approach, the final $R_c$ may still be relatively large even for organic semiconductors with a relatively low $I_p$. This residual $R_c$ may be due to incomplete elimination of the injection barrier due to imperfect gradation of the steps.

A third approach is to introduce a deliberately p-doped interlayer of the organic semiconductor at its junction with the metal electrode, so the p-doped interlayer provides ohmic contact to the organic semiconductor. One method to achieve this is to dope the organic semiconductor at the electrode region through the use of high electron-affinity materials, for example $MoO_x$ and other oxidants, which are co-evaporated or sequentially evaporated with the organic semiconductor.

One example of this is given by Li et al in Superlattices and Microstructures, 50 (2011) pp. 191, where a Pn—$MoO_x$ mixed interlayer is evaporated onto a Pn organic semiconductor layer through a metal mask followed the gold electrode. The $MoO_x$ p-dopes the Pn in the mixed interlayer. The $R_c$ of the OFET was found to decrease from 60 kΩ cm to 7 kΩ cm when the interlayer was optimized.

Another example is given by Lin et al in ECS Solid State Letters, 3 (2014) pp. P81-P83, where a thin layer of 2,3,5, 6-tetrafluoro-7,7,8,8-tetracyanoquinodimethane ($F_4$-TCNQ) is inserted by evaporation between Pn and gold through a shadow mask in top-contact FETs. The $F_4$-TCNQ dopes the contact region of Pn. The $R_c$ was found to decrease from 44 kΩ cm to 30 kΩ cm.

A third example is given by Vanoni et al in Applied Physics Letters, 90, 193119 (2007), where $F_4$-TCNQ is co-evaporated with Pn to give a doped Pn layer in a bottom-gate bottom-contact FET. The $R_c$ was found to decrease from 110 kΩ cm to 5 kΩ cm.

A fourth example is given by Minari et al in Applied Physics Letters, 100 (2012) pp. 093303, where $FeCl_3$ is evaporated through a shadow mask to dope the contact region of a dioctylbenzothienobenzothiophene film before evaporation of the Au source-drain electrodes in a top-contact FET. This was found to reduce $R_c$ from 200 kΩ cm to 9 kΩ cm.

Therefore it is clear that doping of the contact region can reduce $R_c$ significantly. However there are several critical challenges for the methods in these prior art. In general, these methods require multi-step vacuum processing through a shadow or lithography mask. This greatly increases complexity and cost, and limits scalability. They are also not amenable to solution processing. Secondly, in those cases with small molecular or inorganic complex dopants, the dopant molecules or complexes may migrate over time inside the organic semiconductor. This eventually degrades the doping profile at the contact and hence its $R_e$. It is thus desirable to develop alternative approaches to doping of the contact region that can overcome these A second method to dope the organic semiconductor at the electrode region is the use of a reactive intermediate layer. Klauk et al in U.S. Pat. No. 6,806,124 describes the use of a reactive intermediate layer to dope the organic semiconductor layer region in the vicinity of the source-drain electrodes. A conducting polymer layer, e.g., p-doped polyaniline, was described with a diffusible dopant, e.g., camphor sulfonic acid. The dopant diffuses into the semiconductor and dopes it in the vicinity of the contact. There is no possibility in this method to limit the diffusion of the dopant to the interface. As the dopant diffuses to the channel region, it leads to high background conductivity and poor ON-OFF ratio.

Klauk et al also describes the use of a bi-functional dopant layer with one group to bind to the metal surface and a second group that acts as oxidant to transfer a hole to the organic semiconductor, thereby p-doping it. Thiols were cited as a possible example. However thiols are not in general compatible with the oxidants needed to dope organic semiconductors with $I_p$ larger than about 5.0 eV.

A third method to create a doped semiconductor layer at the electrode contact is to deposit a doped semi-conductor itself. One example is given by Shih et al in U.S. Pat. No. 7,208,756 and in Journal of Applied Physics, 96 (2004) pp. 454, which describes the use of a very lightly p-doped polymer interlayer at the contacts. This interlayer was deposited from a mixture of the channel material (e.g., poly(3-hexylthiophene)) and low concentrations of a dopant (e.g., $FeCl_3$, at sub-1% concentrations). This lightly-doped interlayer was deposited over the channel also.

Therefore the resistivity of this lightly-doped interlayer needs to be selected such that its resistance is much higher than that provided by the ON state of the channel but yet low enough to reduce $R_e$. It turns out this condition is very demanding and cannot be met in most cases. For example, if an ON-OFF ratio of greater than 1,000 is desired in a relatively high-mobility material, e.g., lightly-doped poly(3-hexylthiophene) with $\mu_{FET}$=0.1 $Cm^2$ $V^{-1}$ $s^{-1}$, it is not possible to reduce $R_c$ from 180 MΩ cm to below 600 kΩ cm without sacrificing the ON-OFF ratio.

Another critical challenge for this method is the lack of provision for self-alignment of the doped interlayer to the electrodes that avoids depositing a conductive layer over the channel region. There is also no possibility to suppress dopant diffusion out of the interlayer and resultant degradation of device performance during subsequent solvent processing, thermal treatment, on storage and during operation.

A fourth method is given by Schaur et al Organic Electronics, 13 (2012) pp. 1296, which describes the use of conventional electrochemistry to create a shallow p-doped region at the junction between an electrode and a crystalline organic semiconductor thin film Pn, in a top-contact bottom-gate FET. The $R_c$ was found to decrease from 390 kΩ cm to 140 kΩ cm. This method requires the use of electrochemistry and is not able to generate a continuous p-doped layer over the entire buried contact of the electrode.

From the summary above, it is clear that there is still a need to provide for an improved device structure that can reliably give $R_e$ less than 30 kΩ cm for organic semiconductors with $I_p$ larger than 5.0 eV, e.g., 5.0-5.8 eV. There is further a need to provide for a layer that can provide for such an ohmic contact. There is further a need to provide for a method to deposit such a layer.

The present invention discloses a transistor device structure that provides for controlled p-doping of an ultrathin layer of the semiconductor over the source-drain electrode array by inserting a molecularly-thin layer of bonded anions at the junction between the electrode array and the semiconductor. This molecularly-thin layer is first formulated with oxidant species during fabrication of the device. Without thereby being limited by theory, the oxidant produces p-doping of the semiconductor interface. The semiconductor layer may already be present or is subsequently deposited. The oxidant by-product is removed from the inter-face, and the bonded anions then act as counter-anions to the p-doped interface. This bonded-anion layer can be self-aligned to the electrode array using various methods depending on device configuration. The limited oxidant together with the bonded-anion layer ensures only localized doping of an ultrathin layer of the semiconductor over the electrode. The invention further provides for the oxidant-containing layer employed during fabrication to achieve this controlled p-doping of the semiconductor. The invention further provides a self-aligned method based on solution processing to produce such a layer. This produces field-effect transistors which show ohmic injection and high performance for semiconductors with $I_p$ larger than 5.0 eV, which was not previously possible.

In one embodiment, the transistor device structure may comprise the following:
(i) A patterned source-drain electrode array layer;
(ii) A molecularly-thin layer of bonded anions self-aligned to the source-drain electrode array pattern, and sandwiched between the electrode layer and the semiconductor layer;
(iii) A semiconductor layer, with a p-doped interface adjacent to the bonded-anion layer;
(iv) A gate dielectric layer;
(v) A patterned gate-electrode layer.

In one embodiment, the oxidant-containing layer may comprise the following:
(i) A polymer or oligomer attached with anions and optionally with substrate-binding groups;
(ii) Oxidant cation species with standard electrode potential larger than 0.5 V vs standard hydrogen electrode.

In one embodiment, the method of making the oxidant-containing layer may comprise the following:
(i) Deposition of a molecularly-thin layer of a polymer or oligomer attached with anions and optionally with substrate-binding groups, containing a first cation;
(ii) Exchange of the first cation with the oxidant cation.

The key benefit of this method is the separation of the roles of the counter-anion provided by the bonded anions and the p-dopant provided by the oxidant species. As a result, the oxidant can be selected appropriately to match the $I_p$ of the semiconductor, while the bonded-anion layer can be selected to adhere to the substrate and provide the desired processing, thermal, storage and operation stability of the p-doped inter-face.

Consequently, a first aspect of the invention provides for a field-effect transistor device structure that incorporates the molecularly-thin layer of bonded anions between the source-drain electrode array layer and the semiconductor layer, wherein the semiconductor layer is p-doped at its interface with this bonded-anion layer, and the molecularly-thin layer of bonded anions is capable of binding to the substrate on which it is formed.

A second aspect of the invention provides for an oxidant-containing molecularly-thin layer of bonded anions and oxidant species.

A third aspect of the invention provides for a method to fabricate the said layer.

A fourth aspect of the invention provides for a method to fabricate the said field-effect transistor structure.

A fifth aspect of the invention provides for the use of the said field-effect transistor structure in electronic circuits.

The device structure is shown in FIG. 1 for each of the four possible device configurations. The semiconductor layer is selectively p-doped at its contact with the molecularly-thin bonded-anion layer aligned to the source-drain electrode array. The layer of bonded anions can be self-aligned to the electrode array using various methods as described later, depending on the device configuration. This removes the need for a separate patterning and registration step. It also ensures the p-doped layer is formed exactly where it is needed to give ohmic injection.

Without thereby being limited by theory, this device structure has the key advantage that because the positive charges in the p-doped semiconductor are counterbalanced by the bonded anions, the doping profile, i.e., the doped carrier density as a function of location in the semiconductor, becomes fixed by the location of this layer of bonded anions. As a consequence, the doping profile is desirably limited to an ultrathin layer, a few nanometers thick, adjacent to the bonded-anion layer. Furthermore, since the bonded anions cannot diffuse, the doping profile also cannot smear out and degrade over time. Thus the p-doped interface is stable to device processing, baking to moderate temperatures (up to 180° C.), storage and operation. This device structure thus has a built-in immunity to dopant migration and the resultant degradation of the doping profile.

The bonded anions counterbalance the positive charges of the p-doped polymer interface in the final transistor structure. However the bonded-anion layer is deposited together with an oxidant species in an initial stage of device processing, during which the bonded anions are counterbalanced by spectator or the oxidant cations. For bottom-contact device configurations, this oxidant-containing layer is deposited after the electrode array layer or layers, but before the semiconductor layer or layers. For top-contact device configurations, this oxidant-containing layer is deposited after the semiconductor layer or layers, but before the electrode array layer or layers.

Without thereby being limited by theory, an electron transfer occurs from the semiconductor to the oxidant species in the bonded-anion layer. This causes an oxidation, i.e., p-doping, of the semiconductor interface and a corresponding reduction of the oxidant species. During this process, spectator or oxidant cations are spontaneously eliminated, as a result of which the positive charges of the p-doped polymer become counterbalanced by the bonded anions.

Thus the term "bonded-anion layer" in the final device structure refers to the layer of anions that are counterbalanced by the p-doped polymer, while in an intermediate stage of processing before p-doping of the semiconductor, it refers to the layer of anions that are counterbalanced by their spectator and/or oxidant cations. The intended meaning will be clear from the context in which the term is used. The term "bonded-anion material" refers to the material that is deposited to give the bonded-anion layer.

The role of the bonded anions is to eventually balance the positive charges of the interfacial p-doped polymer. Therefore they should not undergo chemical reactions with the p-doped polymer. This requires the anions should be only weakly nucleophilic, and preferably non-nucleophilic. Nucleophilicity is the tendency of the anion to take part in bond-forming reaction with an electrophile which is the positively-charged organic semiconductor (See for example: March's Advanced Organic Chemistry: Reactions, Mechanisms and Structures, Wiley). Suitable bonded anions include sulfonate, fluoroalkylsulfonate, carboxylate, fluoroalkylcarboxylate, phosphonate, phosphate and sulfate, and a combination thereof, more preferably, sulfonate, fluoroalkylsulfonate and fluoroalkylcarboxylate.

These anions are covalently attached in the bonded-anion material, preferably to a suitable polymer or oligomer backbone. Polymers are macromolecules with relatively high molecular weights of more than 5 kDa, and typically more than ten identical or dissimilar monomer units bonded together. Suitable polymer backbones include non-conjugated ones, such as polystyrene, polyacrylate, polymethacrylate, poly(vinyl alcohol), poly(allyl amine), polyethyleneimine; and more preferably conjugated ones, such as polydiketo-pyrrolo[3,4-c]pyrrole, polythiophene, poly(bithiophene-alt-thienothiophene). It is further preferable to choose a conjugated core that is similar to the one used as the semiconductor in the device. Oligomers are macromolecules with relatively low molecular weights of 5 kDa or less, and typically at least two and up to ten identical or dissimilar monomer units bonded together. Suitable oligomer backbones include low-molecular-weight variants of the above.

The anionic groups are attached to the polymer or oligomer at a density of one anionic group per $0.2$ nm$^3$ to $4$ nm$^3$ of the bonded-anion layer. The attachment may be through short alkyl chain spacers. The bonded-anion layer may thus be a homopolymer, a copolymer, a homo-oligomer, or a co-oligomer. In one embodiment, it is a polyelectrolyte. A polyelectrolyte is a polymer with a high density of ionic groups, such as one anionic group per $0.2$-$1$ nm$^3$. In another embodiment, the bonded-anion layer is an ionomer. An ionomer is a polymer with a low density of ionic groups, such as one or less anionic group per $2$ nm$^3$ of the material.

The anionic groups may initially be counter-balanced by spectator cations. Spectator cations are cations that are present in the bonded-anion layer to counterbalance the anions but do not provide an oxidizing role. Examples of spectator cations are lithium, sodium, potassium, rubidium, caesium, ammonium and quaternary ammonium. The spectator cations are chosen so that they provide a suitable solvent processability to the bonded-anion layer. The spectator cations may subsequently be replaced by oxidant cations, as described below.

The Applicants found that an ultrathin layer of the bonded anions surprisingly can robustly assemble onto the metal electrode surface to eventually provide the desired charge counterbalance to the p-doped semi-conductor interface. The required thickness of the bonded-anion layer is $0.3$ nm to $3$ nm, and more preferably $0.5$ nm to $2$ nm. We call such layers "molecularly-thin" because they correspond to molecular dimensions. Thick bonded-anion layers are less suitable because of the additional electrical resistance they introduce.

Furthermore the molecularly-thin bonded-anion layer can be readily formed on the substrate by self-assembly, and preferably to a pre-patterned electrode surface by self-alignment. It is generally not possible to reliably form a thick layer in this way.

The required film thickness can be estimated using variable-angle spectroscopic ellipsometry for the case of deposition on well-defined model substrates, such silicon or gold, after suitable modelling of the optical dielectric functions of the initial substrate surface (see for example: Fujiwara, in Spectroscopic Ellipsometry: Principles and Applications, Wiley (Singapore)). The film thickness can also be estimated using X-ray photoemission spectroscopy of the core-levels of marker atoms present in the bonded-anion layer, through the well-known electron attenuation effects related to the inelastic mean free path effects of the photoemitted electrons (see for example: Briggs and Seah, in Practical Surface Analysis by Auger and X-ray Photoemission Spectroscopy, Wiley (Singapore)).

The choice of anionic density in the bonded-anion layer is determined by the preferred p-doping density at the interface of the semiconductor and the thickness of the bonded-anion layer. Without being thereby limited by theory, the product of the thickness of the layer (in nm) and its anionic density (in anionic charges per $nm^3$) gives the total areal anionic charge density and hence the maximum p-doping density that the bonded-anion layer can support (in holes per $nm^2$) at the semionductor interface. A preferred p-doping density is $3 \times 10^{12}$-$3 \times 10^{14}$ holes per $cm^2$, or more preferably $1 \times 10^{13}$-$1 \times 10^{14}$ holes per $cm^2$.

Furthermore, the bonded-anion layer may optionally contain substrate-binding groups. The Applicants found surprisingly that certain anionic groups, e.g., sulfonate and phosphonate, are able to bind non-specifically in a general way to metal electrode surfaces, e.g., gold, silver and copper. However they do not bind to hydrophobic surfaces, such as plastic foils made of poly(ethylene terephthalate), poly(ethylene naphthalate), polyimide, polycarbonate and HMDS-treated $SiO^2$ wafers, which often form the substrate for the metal electrodes.

Without being thereby limited by theory, the highly-polarizable anionic groups together with their counter-cations are believed to provide stronger van der Waals interaction with metallic surfaces than organic surfaces through the London dispersion mechanism. This enables the selective assembly of the bonded-anion layer onto the electrode surfaces. Hence self-alignment of this layer to the underlying patterned electrode array layer can be achieved. This may be particularly useful for bottom-contact FET devices.

An example of a suitable bonded-anion layer for metal electrodes is the family of polystyrenesulfonate polyelectrolytes. This includes poly(styrenesulfonic acid), and its salts with lithium, sodium, potassium, rubidium, cesium, ammonium and tetramethylammonium.

Another example of a suitable bonded-anion layer is a polyelectrolyte complex that has an overall anionic bonded charge that is counterbalanced by free cations. A polyelectrolyte complex is a material comprising a polycation and polyanion. If the cationic charges in the polycation are short of the number required to compensate the anionic charges in the polyanion, the polyelectrolyte complex is overall anionic. An example of a suitable polyelectrolyte complex is poly(3,4-ethylenedioxythiophene):poly(styrene sulfonic acid) (PEDT:PSSH). Another example of a suitable bonded-anion layer is an anionic polyampholyte that has excess bonded anionic charges over the bonded cationic charges.

Other examples of a suitable bonded-anion layer include the conjugated polyelectrolytes poly(N,N-bis(3-sulfonato-propyl)-1,4-diketopyrrolo[3,4-c]pyrrole-3,6-diyl-aft-terthiophene cesium) and poly(3-sulfonatobutylthiophene-2,5-diyl potassium).

Nevertheless it may be further advantageous to incorporate additional specific binding groups that can bind to the metal electrode surfaces. Examples include hydroxamic acid and its salt, catechol and its salt, thiophene, pyridine and amine. These groups may be incorporated at a low concentration, preferably 5-20 mol % (by repeat unit), as pendant groups in the bonded-anion material.

For binding to an organic semiconductor film substrate in top-contact devices, the bonded-anion material may preferably have substrate-binding groups that can bind to the desired organic semiconductor film. Without being thereby limited by theory, such groups may form donor-acceptor complexes with the semi-conductor. These include electron-withdrawing groups, such as dinitrophenyl, dicyanophenyl, perfluorophenyl and polychloronaphthyl, and their derivatives, which can bind to electron-rich organic semiconductors; and electron-donating groups, such as dialkoxyphenyl, dihydroxyphenyl, diaminophenyl, and their derivatives, which can bind to electron-poor organic semiconductors. Other examples of binding groups are those that give non-specific interactions with the organic surface. These include perfluoroalkyl and perfluoroalkoxyl chains. These groups may be incorporated at a low concentration, preferably 5-20 mol % (by repeat unit), as pendant groups in the bonded-anion material.

The oxidant-containing bonded-anion layer contains one or a plurality of oxidant species that performs the role of p-doping of the semiconductor. An oxidant specie is any suitable low-molecular-weight reagent that can oxidize, i.e. p-dope, the intended semiconductor. Thus this is also called the p-dopant.

A suitable oxidant is a one-electron oxidant that is also a cation. A one-electron oxidant causes the transfer of one electron and hence doping of the semiconductor with one hole per oxidant molecule or ion. This may be incorporated into the bonded-anion material by ion exchange. This may also be incorporated into the bonded-anion layer by contacting the layer with a suitable solution of these oxidant cations through a cation-exchange mechanism. Preferably, the oxidant cation is also single-charged cation. In this case, the p-doping leads the oxidant to form an uncharged by-product that may advantageously removed be from the bonded-anion layer during processing.

Examples of singly-charged cations that can be used as one-electron oxidants include (standard electrode potential E° vs standard hydrogen electrode SHE): tris(p-nitrophenyl) aminium (1.84 V), tris(2,4-dibromophenyl)aminium (1.78 V), tris(p-cyanophenyl)aminium (1.72 V), nitronium (1.51 V), thianthrenium (1.5 V), nitrosonium (1.42 V), tris(p-bromophenyl)aminium (1.34 V), tris(p-methylphenyl) aminium (1.04 V), tris(p-butylphenyl)aminium) and tris(p-methoxyphenyl)aminium (0.80 V).

A suitable oxidant specie may also be any oxidant specie that can p-doped the semiconductor. Examples include peroxydisulfate (2.1 V) and hydrogen peroxide (1.8 V). These oxidants may be incorporated into the bonded-anion layer by contacting the layer with a suitable solution of these oxidants.

A selection criteria for the oxidant is its standard electrode potential E°. The E° is the electrode potential at which unit activity of the oxidant is in equilibrium with unit activity of its reduced specie. This can be readily measured by voltammetry (see for example: Faulkner and Bard, Electrochemical Methods: Fundamentals and Applications, Wiley (Singapore)). A more positive E° indicates a more powerful oxidant. Without being thereby limited by theory, the following guideline may be useful. The required oxidant should preferably have an E° (vs SHE) that is more positive than ($I_p$-4.56 V) by about 0.3 V, where $I_p$ is the ionization potential of the semiconductor film.

It is further advantageous to choose the oxidant that is just sufficiently powerful to p-dope the semiconductor. A more powerful oxidant tends to be less stable in the ambient.

The ionization potential of the semiconductor is the minimum energy required to remove an electron from the HOMO edge of the semiconductor in the solid film. This can be found by ultraviolet photoemission spectroscopy (UPS) from the energy difference between the onset of photoemission and the vacuum level found from the low kinetic energy cut-off in the spectrum.

For bottom-contact devices, a suitable bonded-anion layer is deposited by self-assembly on the source-drain electrode surface. This can be achieved by contacting the substrate with a dilute solution in a suitable solvent of the desired bonded-anion material using spin-coating, dip-coating, inkjet-printing or other solution processing methods. The required solution concentration may be found by experimentation (typically 0.25-10 mg/mL). A short contact time (1-5 min) at room temperature or slightly elevated temperature may be required. The excess material is then removed with a suitable solvent. A suitable solvent is any solvent that dissolves the bonded-anion material. A short baking at a moderately low temperature may be useful to further improve adhesion of the bonded-anion layer to the electrode surface. The exact conditions can be determined by a person skilled-in-the-art.

The bonded-anion layer selectively binds to the source-drain electrode array but not the hydrophobic space, i.e., channel region, in-between the electrodes. In this way, self-alignment to the electrode pattern is achieved.

The oxidant may be incorporated into the bonded-anion material or may be subsequently introduced into the deposited bonded-anion layer. To do the latter, a solution of the oxidant in a suitable solvent (typically 10-50 mM) is brought in contact with the bonded-anion layer for a short period of time (typically 1-30 s) and the solution then removed by spinning, or dip-rinsing in a solvent bath. The excess oxidant is then removed by a suitable solvent. A suitable solvent is one that dissolves the oxidant material but not the bonded-anion layer.

The semiconductor overlayer is then deposited by a suitable solvent. This produces the p-doped interface with the bonded anions acting as counter-anions. The reduced oxidant by-product may be removed simultaneously by the solvent used to deposit the semiconductor. In some cases, a mild baking step may be required to activate the p-doping (typically 100-120° C., 1 min).

The presence of the oxidant species in the bonded-anion layer may be verified if desired by any method that is sensitive to the presence of the oxidant species in ultrathin films. This includes X-ray photoemission spectroscopy. In cases where the oxidant species exhibit a resonance-enhanced Raman scattering cross-section, Raman spectroscopy can also be used.

For top-contact devices, a suitable bonded-anion layer is deposited by self-assembly on the semiconductor surface which now acts as the substrate. This can be achieved by contacting the substrate with a dilute solution in a suitable solvent and processing as described above. The oxidant may be incorporated as described above. It is advantageous to choose an oxidant specie and solvent that do not allow penetration of the oxidant specie beyond the bonded-anion layer. This means that the oxidant specie should preferably be large, and the solvent should preferably be a poor solvent for the underlying semiconductor. The presence of the bonded-anion layer may be verified as discussed above.

In this process the semiconductor underlayer is simultaneously p-doped with the bonded anions acting as counter-anions. The source-drain electrode array layer may then be deposited by evaporation through a shadow mask. The p-doping in the channel region may then be deactivated by a brief contact with a suitable reductant, e.g., hydrazine vapor, or a short oxygen plasma through the source-drain electrode array which now acts as a mask. This produces thus a p-doped interface that is self-aligned to the electrode array.

Hence for a top-gate-bottom-contact device, the patterned source-drain electrode array layers are deposited first, followed by self-aligned deposition of the bonded-anion layer incorporating the oxidant species, followed by the semiconductor layers, the gate dielectric layers, and the patterned gate electrode layers.

For a bottom-gate-bottom-contact device, the patterned gate electrode layers are deposited first, then the gate dielectric layers, the patterned source-drain electrode array layers, followed by the self-aligned deposition of the bonded-anion layer incorporating oxidant species, followed by the semiconductor layers. An embodiment is illustrated in FIG. 2.

For a bottom-gate-top-contact device, the patterned gate electrode layers are deposited first, then the gate dielectric layers, the semiconductor layers, the bonded-anion layer incorporating the oxidant species, followed by the patterned source-drain electrode layers, and then optional deactivation of the p-doping in the channel region.

For a top-gate-top-contact device, the semiconductor layers are deposited first, followed by the bonded-anion layer incorporating the oxidant species, followed by the patterned source-drain electrode array layers, and then optional deactivation of the p-doping in the channel region, followed by deposition of the gate dielectric layers and the patterned gate electrode layers.

To evaluate $R_c$ the Applicants have developed a self-consistent transmission line method (TLM) that could be reliably extracted this quantity from the measured transistor current-voltage characteristics as a function of source-drain current and channel carrier density. Briefly, the transfer curves of field-effect transistors are collected and corrected for gate leakage. The source-drain current ($I_{ds}$) is then extracted at selected gate voltages ($V_{gs}$) for different source-drain voltages ($V_{ds}$) to give an $I_{ds}$-$V_{ds}$-$V_{gs}$ surface, and normalized to channel width. This surface is fitted with a polynomial function to interpolate $V_{ds}$ at different $I_{ds}$ and $V_{gs}$. $R_{tot}$ is then obtained by $R_{tot}$=-$V_{ds}/I_{ds}$. This procedure is repeated for different channel lengths to give $R_{tot}$ against L plot from which $R_c$ can be obtained as intercept. $R_c$ was evaluated as a function of $V_{gs}$. The $R_e$ can then be obtained by subtracting the $R_c$ contribution from modeling of the space-charge-limited current. For ohmic contacts, the devices show very little dependence of $R_e$ on $I_{ds}$ and $V_{gs}$. $r_e$ can then be obtained from $R_c$ by normalizing with the effective electrode area obtained self-consistently from a transmission-line model of current flow.

An example of contact resistance extraction results from an improved performance FET device using intermediate bonded-anions layer PSSTPA. is shown in FIG. 9.

The typical $r_e$ of gold electrodes measured for a model high-mobility hole-type polymer organic semiconductor, poly(N,N-bis(2-octyldodecyl)-1,4-diketopyrrolo[3,4-c]pyrrole-3,6-diyl-alt-terthiophene) (DPPT-T2), with $I_p$ of 5.3 eV is about 20 Ω cm². This produces a sizeable $R_c$ that is similar to or larger than $R_{SCLC}$. As a consequence, the typical field-effect transistors with channel lengths shorter than 50 µm are limited by contacts. Using the invention disclosed here, the Applicants have achieved $r_c$ as low as 2 Ω cm², which is good enough to reach the idealized ohmic contact for charge-carrier injection into a semiconductor film with a bulk charge carrier mobility of $10^{-3}$ cm²/Vs, which is not previously possible.

This invention can provide ohmic contacts to semiconductors with $I_p$ up to 5.8 eV. The method is suitable to make ohmic contacts in field-effect transistors to organic semiconductors with $I_p$ from 4.5 eV to 5.8 eV, in particular to semiconductors with $I_p$ from 5.0 eV to 5.8 eV, which is particularly challenging.

This invention can also be applied by straightforward extension to other types of field-effect transistors based on metal oxides, organic crystals, organic-inorganic hybrid crystals, inorganic nanocrystals and nanowires, fullerenes, carbon and other nanotubes, and graphene as the semiconductor.

FIG. 1 shows the schematic representations of the four possible FET device configurations incorporating the semiconductor layer (12, 22, 32, 42 respectively) which is p-doped at its interface (17, 27, 37, 47 respectively) with the bonded-anion layer (16, 26, 36, 46 respectively) for (a) a bottom-contact bottom-gate transistor configuration, (b) a top-gate bottom-contact transistor configuration, (c) a bottom-gate top-contact transistor configuration, (d) a top-gate top-contact transistor configuration. The "bottom-gate" configurations refer to those where the gate (15, 25, 35, 45) and gate-dielectric (14, 24, 34, 44) layers are below the semiconduct layer (12, 22, 32, 42). The "top-gate" configurations refer to those where the gate and gate-dielectric layers are above the semiconductor layer. The "bottom-contact" configurations refer to those where the source (11, 21, 31, 41) and drain electrode (13, 23, 33, 43) layer is below the semiconductor layer. The "top-contact" configurations refer to those where the source and drain electrode layer is above the semiconductor layer.

Figure 4:
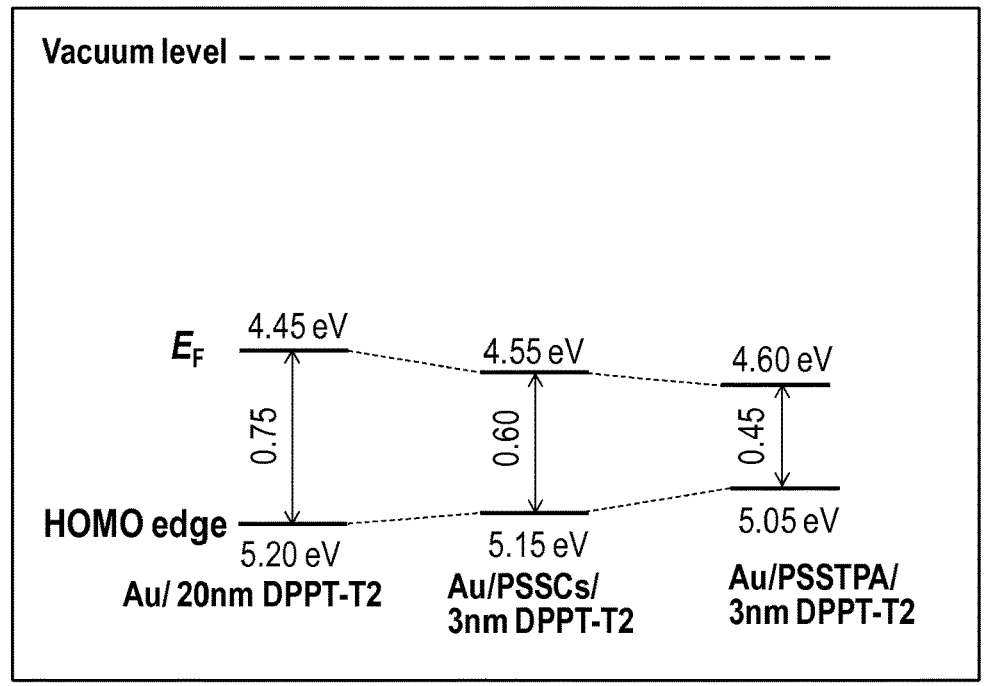

FIG. 4 shows the ultraviolet photoelectron spectroscopy evidence of ultra-thin p-doped DPPT-T2 organic semiconductor. 20-nm-thick DPPT-T2 pristine film on Au (leftmost panel). The decrease in $E_F$-HOMO gap for the 3-nm-thick DPPT-T2 film deposited on bonded-anion layer counter-balanced by spectator cations (PSSCs) on Au (middle panel) and further decreases in $E_F$-HOMO gap when deposited on bonded-anion layer counter-balanced by oxidant cations (PSSTPA) on Au (right panel).

Figure 5:
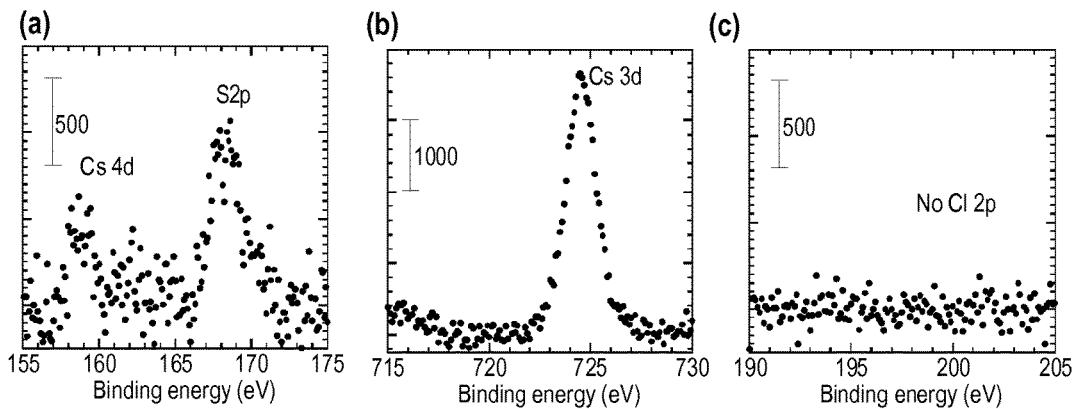
Figure 6:
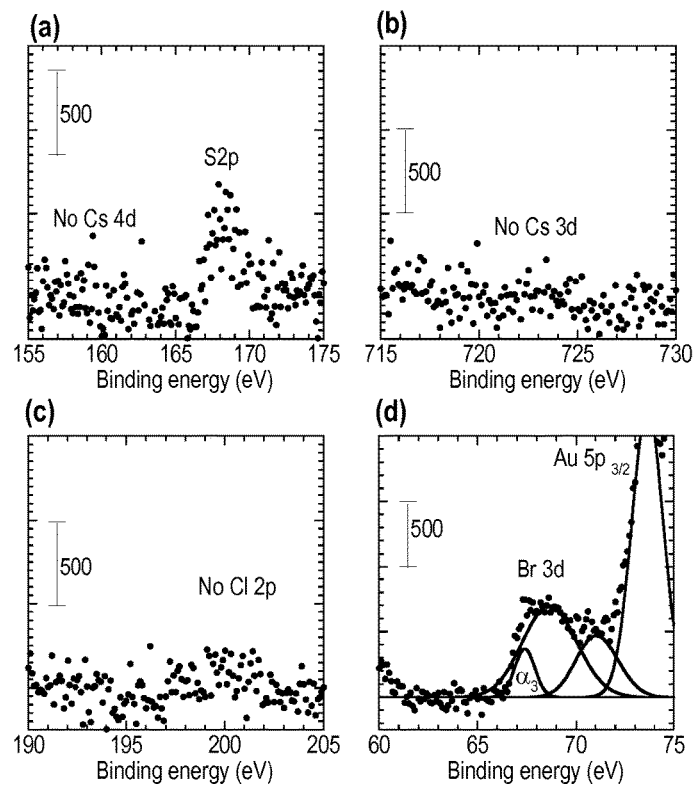

FIG. 5 shows the X-ray photoelectron spectroscopy evidence of the molecularly-thin bonded-anion layer counter-balanced by spectator cations (PSSCs) on 7-nm Cr/30-nm Au. (a) S 2p, Cs 4p (b) Cs 3d. (c) Cl 2p FIG. 6 shows the X-ray photoelectron spectroscopy evidence of the molecularly-thin layer of bonded anions counter-balanced by oxidant cations (PSSTPA) on 7-nm Cr/30-nm Au (a) S2p, Cs 4p (b) Cs 3d. (c) Cl 2p.

Figure 7:
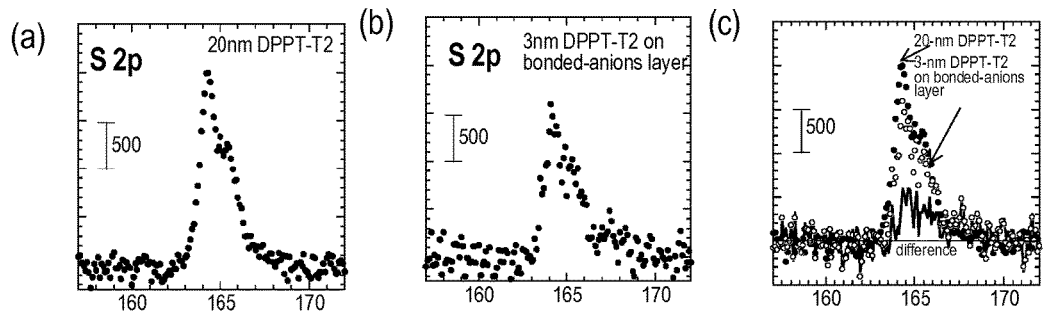

FIG. 7 shows the X-ray photoelectron spectroscopy evidence doped DPPT-T2 organic semiconductor. (a) S2p core-level XPS of 20-nm-thick pristine DPPT-T2 organic semiconductor film on 7-nm Cr/30-nm Au; (b) of 3-nm-thick pristine DPPT-T2 organic semiconductor film on molecularly-thin layer of bonded anions counter-balanced by oxidant cation (PSSTPA) (c) difference spectra in (a) and (b) reveals a broadening towards high binding energy tail.

Figure 8:
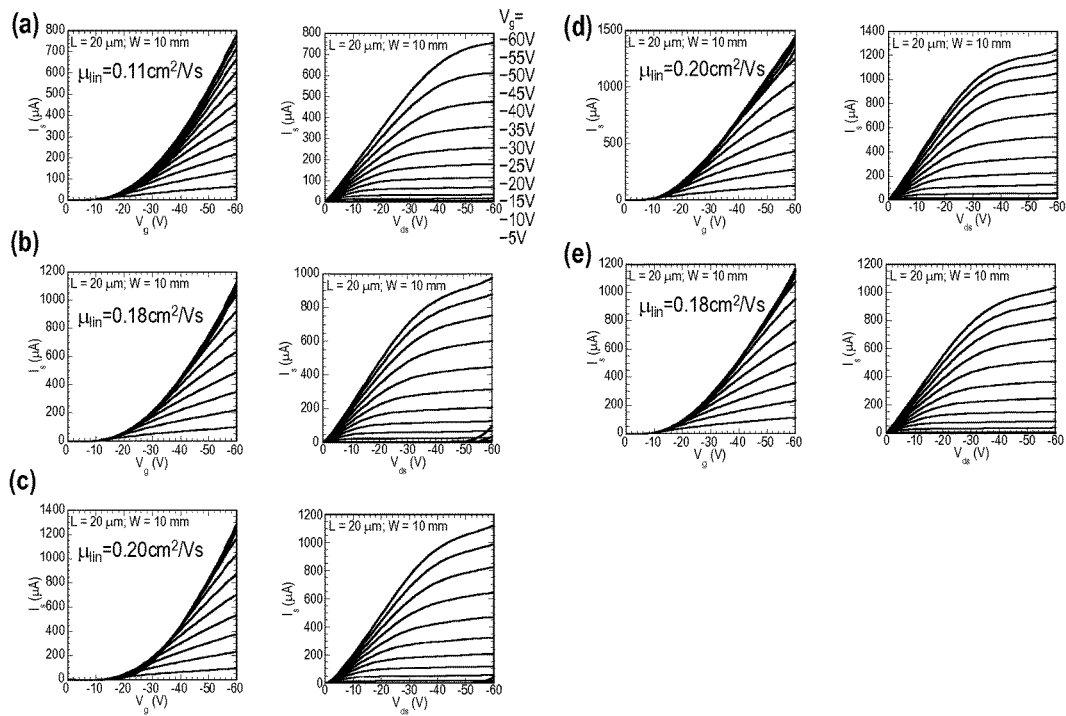

FIG. 8 shows the transfer (left panel) and output (right panel) curves of DPPT-T2 organic semiconductor top-gate-bottom-contact field-effect-transistors with and without modifcation of the Au source-drain electrodes (a) Au (b) PSSCs/Au (c) PSSH/Au (d) PSSTPA/Au (e) PSSNO/Au.

Figure 9:
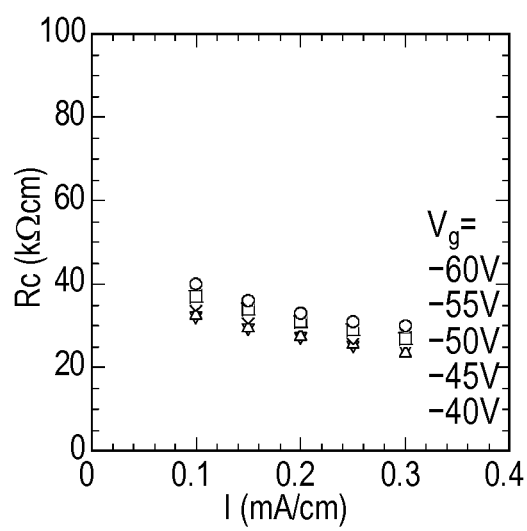

FIG. 9 shows the dispersion of contact resistance ($R_c$) values extracted using the transmission line method (TLM) over a range of normalised current (I) and gate voltage ($V_g$) values for improved DPPT-T2 organic semiconductor top-gate-bottom-contact field-effect-transistors using bonded-anions layer counter-balanced by oxidant cations (PSSTPA).

EXAMPLES

Example 1: Preparation of Intermediate Molecularly-Thin Layer of Bonded Anions Layer Example 1a: Poly(Styrene Sulfonic Acid) (PSSH)—Ion-Exchanged Poly(styrene sulfonic acid) (PSSH, Science Polymer Products Inc, Mw 70 k) was used. Its concentration was determined by gravimetric analysis to be 200 mg/mL. 1 g of cationic ion-exchange resins (Amberlyst® 15 hydrogen form, Sigma-Aldrich) were first treated with 47 mM hydrochloric acid for 2 h and then rinsed with Millipore® water. 1 g of H⁺ ion-changed resins are then immersed into the 0.437 mL of PSSH solution for 2 h. It was then diluted to 2 mg/mL using Millipore® water for further use.

Example 1b: Poly(Styrene Sulfonic Acid) (PSSH)—Dialyzed

Poly(styrene sulfonic acid) (PSSH, Science Polymer Products Inc, Mw 70 k) was used. Its concentration was determined by gravimetric analysis to be 200 mg/mL. It was dialysed in 0.1 M HCl solution and allowed to stir for 2 h, repeated three times and finally with Millipore® water. The product dialysed PEDT:PSSH solution was then diluted to 2 mg/mL using Millipore® water for further use.

Example 1c: Cesium Poly(Styrene Sulfonate) (PSSCs)—Ion-Exchanged

Poly(styrene sulfonic acid) (PSSH, Science Polymer Products Inc, Mw 70 k, 200 mg/mL) was used. 1 g of cationic ion-exchange resins (Amberlyst® 15 hydrogen form, Sigma-Aldrich) were first treated with 47 mM of cesium acetate solution (Cs(OAc) for 2 h and then rinsed with Millipore® water. These Cs⁺ ion-exchanged resins are then immersed into the 0.437 mL of PSSH solution for 2 h. The product PSSCs solution was then diluted to 2 mg/mL using Millipore® water for further use.

Example 1d: Cesium Poly(Styrene Sulfonate) (PSSCs) Polyanion Interlayer—Dialyzed Poly(styrene sulfonic acid) (PSSH, Science Polymer Products Inc, Mw 70 k, 200 mg/mL) was used. It was dialysed in 0.1 M CsCl solution and allowed to stir and rotate for 2 h, repeated three times and finally with Millipore® water. The product dialysed PSSCs solution was then diluted to 2 mg/mL using Millipore® water for further use.

Example 1e: Lithium Poly(Styrene Sulfonate) (PSSLi)—Ion-Exhanged

Poly(styrene sulfonic acid) (PSSH, Science Polymer Products Inc, Mw 70 k, 200 mg/mL) was used. 1 g of cationic ion-exchange resins (Amberlyst® 15 hydrogen form, Sigma-Aldrich) were first treated with 47 mM lithium acetate solution (Li(OAc) for 2 h and then rinse with Millipore® water. These $Li_+$ ion-exchanged resins are then immersed into the 0.437 mL of PSSH solution for 2 h. The product PSSLi solution was then diluted to 2 mg/mL using Millipore® water for further use.

Example 1f: Sodium Poly(Styrene Sulfonate) (PSSNa)

Sodium poly(styrene sulfonate) (PSSNa, Fluka) was used as purchased. It was dissolved into a 2 mg/mL solution in Millipore® water for use.

Example 1g: Poly(3,4-Ethylene Dioxythiophene):Poly(Styrene Sulfonic Acid) (PEDT:PSSH)—Dialyzed Poly(3,4-ethylene dioxythiophene):poly(styrene sulfonic acid) (PEDT:PSSH, Heraeus Precious Metals GmbH & co, ratio 1:6) was used as purchased. It was dialysed in 0.1 M HCl solution and allowed to stir for 2 h, repeated three times and finally with Millipore® water. The product dialysed PEDT:PSSH solution was then diluted to 2 mg/mL using Millipore® water for further use.

Example 1h: Poly(3,4-Ethylene Dioxythiophene):Cesium Poly(Styrene Sulfonate) (PEDT:PSSCs)—Dialyzed Poly(3,4-ethylene dioxythiophene):poly(styrene sulfonic acid) (PEDT:PSSH, Heraeus Precious Metals GmbH & co, ratio 1:6) was used as purchase. It was dialysed in 0.1 M CsCl solution and allowed to stir and rotate for 2 h, repeated three times and finally with Millipore® water. The product dialysed PEDT:PSSCs solution was then diluted to 2 mg/mL using Millipore® water for further use.

Example 2: Preparation of Oxidant Solution

Example 2a: Tris(4-Bromophenyl Ammoniumyl) Hexachloroantimonate (TPA$^+$SbCl$_6^-$)

Tris(4-bromophenyl ammoniumyl) hexachloroantimonate (TPA$^+$SbCl$_6^-$, Sigma-Aldrich) was used as purchased. 30 mM of TPAm$^+$SbCl$_6^-$ in anhydrous propylene carbonate (Sigma-Aldrich) was prepared. Alternatively, 30 mM TPAmSbCl$_6$ solution can be prepared in anhydrous nitromethane, or in anhydrous acetonitrile, or in 1:1 anhydrous nitromethane:toluene.

Example 2b: Nitrosonium Hexafluoroantimonate (NO$^+$SbF$_6^-$)

Nitrosonium hexafluoroantimonate (NO$^+$SbF$_6^-$, Sigma-Aldrich) was used as purchased. 30 mM of NO$^+$SbF$_6^-$ in anhydrous propylene carbonate (Sigma Aldrich) was prepared. Alternatively, 30 mM NO$^+$SbF$_6^-$ solution can also be prepared in anhydrous nitromethane, anhydrous acetonitrile or 1:1 anhydrous nitromethane:toluene.

Example 2c: Thianthrenium Hexafluoroantimonate (ThiA$^+$SbF$_6^-$)

Thianthrene was used as purchased. Separately, 0.25 M of thianthrene in anhydrous chloroform and 0.5 M NO$^+$SbF$_6^-$ in anhydrous nitromethane were prepared. 0.19 mL of nitrosonium hexafluoroantimonate solution was then added into 0.34 mL of thiathrene solution in stoichiometric ratio of 1.1:1.0. ThiA$^+$SbF$_6^-$ was then precipitated using anhydrous ether, followed by dissolution in anhydrous propylene carbonate to give 30 mM ThiA$^+$SbF$_6^-$ solution.

Example 3: Improved FET Performance

Example 3a: Molecularly-Thin of Layer of Bonded Anions with an Oxidant is Prepared from Cesium Poly(Styrene Sulfonate) (PSSCs) Ion-Exchanged with tris(4-bromophenyl ammoniumyl) hexachloroantimonate (TPA$^+$SbCl$_6^-$)

A 0.2-mm-thick polyethylene terephthalate (PET) substrate fabricated with 7-nm Cr/30-nm Au source-drain electrodes with variable channel lengths of L=10, 20, 50, 100 micrometers and channel length 1 centimeters was cleaned by oxygen-plasma (24 seconds, 270 W). The oxygen-plasma cleaned substrate was then immersed in a 2 mg/mL PSSCs solution at 60° C. for 10 minutes to deposit an ultrathin layer of PSSCs film on the Au source-drain electrodes. The substrate was then spin-dried at 5000 rpm and annealed to 120° C. to further promote the adhesion of the ultrathin layer on the Au electrodes. The substrate was spin-washed with Millipore® water at 5000 rpm to remove any residual PSSCs on the channel and annealed to 120° C. for 10 minutes in a nitrogen-purged environment. The final thickness of the PSSCs layer is 2-3 nm. The PSSCs-coated Au electrodes substrate was placed on a spin-chuck and a 30 mM TPA$^+$SbCl$_6^-$ in anhydrous propylene carbonate, was dispensed to cover the surface of the substrate. The TPA$^+$SbCl$_6^-$ solution was kept in contact with the substrate for 30 seconds for ion-exchange to occur, before spin-off at 6000 rpm to remove excess dopant, resulting in PSSTPA film. The film was then spin-washed at 6000 rpm once with anhydrous propylene carbonate to remove excess dopant. An overlayer of 100-nm-thick p-type high mobility DPPT-T2 organic semiconductor was then deposited. A 500-nm-thick gate dielectric, polystyrene (Sigma-Aldrich, Mw 2M) was then deposited above the organic semiconductor, and the device was completed with the thermal evaporation of a 7-nm-thick Cr/30-nm-thick Ag. The contact resistance of this FET extracted using the modified TLM is 18 kΩ cm.

FIG. 4 shows the ultraviolet photoelectron spectroscopy evidence of ultra-thin p-doped DPPT-T2 organic semiconductor.

FIG. 6 shows the X-ray photoelectron spectroscopy evidence of the molecularly-thin layer of bonded anions counter-balanced by oxidant cations (PSSTPA) on 7-nm Cr/30-nm Au.

FIG. 7 shows the X-ray photoelectron spectroscopy evidence doped DPPT-T2 organic semiconductor.

FIG. 8 shows the transfer (left panel) and output (right panel) curves of DPPT-T2 organic semiconductor top-gatebottom-contact field-effect-transistors with and without modification of the Au source-drain electrodes.

Example 3b: Molecularly-Thin Layer of Bonded Anions Counter-Balanced by Oxidant Cations is PSSNO FET fabricated as described in Example 3a in which the molecularly-thin layer of bonded anions is prepared from the 0.5-2 nm PSSCs film treated with 30 mM oxidant solution of $NO^+SbF_6^-$ in anhydrous propylene carbonate. The contact resistance of this FET extracted using the modified TLM is 22 kΩ cm.

FIG. 8 shows the transfer (left panel) and output (right panel) curves of DPPT-T2 organic semiconductor top-gate-bottom-contact field-effect-transistors with and without modification of the Au source-drain electrodes.

Example 3c: Molecularly-Thin Layer of Bonded Anions Counter-Balanced by Oxidant Cations is PSSThiA FET fabricated as described in Example 3a in which the molecularly-thin layer of bonded anions is 3 nm PSSCs film treated with 30 mM oxidant solution of $ThiA^+SbF_6^-$ dissolved in anhydrous propylene carbonate.

Example 3d: Molecularly-Thin Layer of Bonded Anions Counter-Balanced by Oxidant Cations is PEDT:PSSTPA FET fabricated as described in Example 3a in which the molecularly-thin layer of bonded anions is prepared from 2-3 nm PEDT:PSSH film treated with 30 mM oxidant solution of $TPA^+SbCl_6^-$ dissolved in anhydrous propylene carbonate.

Example 3e: Molecularly-Thin Layer of Bonded Anions Counter-Balanced by Oxidant Cations is PEDT:PSSThiA FET fabricated as described in Example 3a in which the molecularly-thin layer of bonded anions is prepared from 2-3 nm PEDT:PSSCs ion-exchanged with 30 mM oxidant solution of $ThiA^+SbF_6^-$ dissolved in anhydrous propylene carbonate.

Example 3f: Molecularly-Thin Layer of Bonded Anions Counter-Balanced by Oxidant Cations is PEDT:PSSTPA FET fabricated as described in Example 3a in which the molecularly-thin layer of bonded anions is prepared from 2-3 nm PEDT:PSSCs ion-exchanged with 30 mM oxidant solution of $TPA^+SbCl_6^-$ in anhydrous propylene carbonate.

Figure 1:
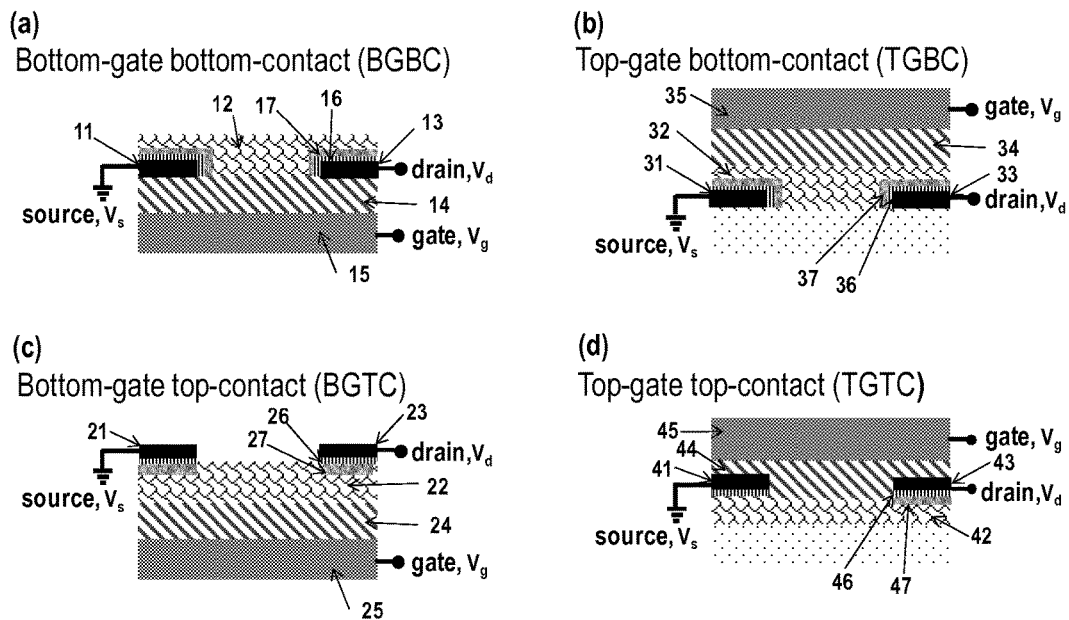
Figure 2:
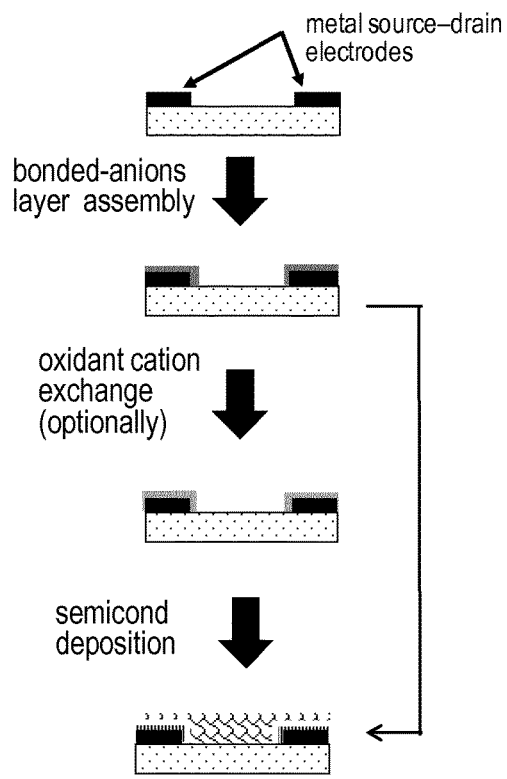
FIG. 2 shows the method of fabrication BGBC configuration incorporating the p-doped semiconductor at the interface with the bonded-anion layer.
Figure 3:
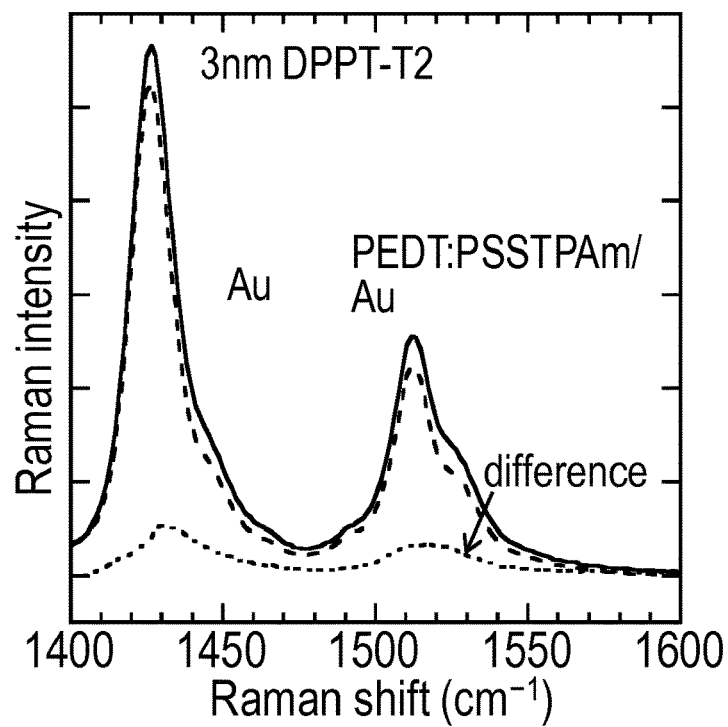
FIG. 3 shows Raman spectroscopy evidence of p-doped DPPT-T2 organic semiconductor film (short black-dash line) from the difference spectra of pristine 3-nm-thick DPPT-T2 organic semiconductor film overlayer on Au (long black-dash line) and on bonded-anion layer counter-balanced by oxidant cations PEDT:PSSTPAm on Au (black-solid line).

FIG. 3 shows Raman spectroscopy evidence of p-doped DPPT-T2 organic semiconductor film

Example 4: Lower FET Performance

Example 4a: Molecularly-Thin Layer Bonded Anions is Cesium Poly(Styrene Sulfonate) (PSSCs)

A 0.2-mm-thick polyethylene terephthalate (PET) substrate fabricated with 7-nm Cr/30-nm Au source-drain electrodes with variable channel lengths of L=10, 20, 50, 100 micrometers and channel length 1 centimeters was cleaned by oxygen-plasma (24 seconds, 270 W). The oxygen-plasma cleaned substrate was then immersed in a 2 mg/mL PSSCs solution at 60° C. for 10 minutes to deposit an ultrathin layer of PSSCs film on the Au source-drain electrodes. The substrate was then spin-dried at 5000 rpm and annealed to 120° C. to further promote the adhesion of the ultrathin layer on the Au electrodes. The substrate was spin-washed with Millipore® water at 5000 rpm to remove any residual PSSCs on the channel and annealed to 120° C. for 10 minutes in a nitrogen-purged environment. The final thickness of the PSSCs layer is 2-3 nm. A 100-nm-thick p-type high mobility DPPT-T2 organic semiconductor was then deposited on the dopant interlayer. A 500-nm-thick gate dielectric, polystyrene (Sigma-Aldrich, Mw 2M) was then deposited above the organic semiconductor, and the device was completed with the thermal evaporation of a 7-nm-thick Cr/30-nm-thick Ag. The contact resistance of this FET extracted using the modified TLM is 27 kΩ cm. This device without the bonded-anions layer incorporating oxidant cations gives significantly lower performance device, with higher $R_c$.

FIG. 5 shows the X-ray photoelectron spectroscopy evidence of the molecularly-thin bonded-anion layer counter-balanced by spectator cations (PSSCs) on 7-nm Cr/30-nm Au.

FIG. 8 shows the transfer (left panel) and output (right panel) curves of DPPT-T2 organic semiconductor top-gate-bottom-contact field-effect-transistors with and without modification of the Au source-drain electrodes.

The invention claimed is:

1. A field-effect transistor device, comprising one or a plurality of layers of a patterned gate electrode adjoined to one or a plurality of layers of gate dielectric, which is adjoined to one or a plurality of layers of semiconductor, which is adjoined to a molecularly-thin layer of bonded anions, which is adjoined to one or a plurality of layers of a patterned source and drain electrode array,
   wherein:
      the semiconductor is p-doped at the interface with the bonded-anion layer; and
      the molecularly-thin layer of bonded anions is capable of binding to the substrate on which it is formed.

2. The device of claim 1, wherein the bonded anions are selected from the group consisting of sulfonate, fluoroalkylsulfonate, carboxylate, fluoroalkylcarboxylate, phosphonate, phosphate, sulfate, and a combination thereof.

3. The device of claim 1, wherein the bonded anions are attached to a polymer or an oligomer backbone and form a molecularly-thin layer on the substrate.

4. The device of claim 1, wherein the molecularly-thin layer of bonded anions is provided with substrate-binding groups capable of bonding to the source and drain electrode surface.

5. The device of claim 1, wherein the molecularly-thin layer of bonded anions is provided with substrate-binding groups capable of bonding to the semiconductor surface.

6. A molecularly-thin oxidant-containing layer, comprising bonded anions and oxidant species,
   wherein:
      the bonded anions are attached to a polymer or an oligomer backbone;
      the oxidant species are low molecular weight species have a standard electrode potential greater than or equal to 0.5 V vs the standard hydrogen electrode in the solvent they are applied; and
      the layer capable of p-doping an adjacent semiconductor layer to give ohmic hole-injection into or ohmic hole-extraction from the semiconductor.

7. The layer of claim 6, wherein the oxidant species are one or a plurality of cations which are capable of giving oxidation by one-electron transfers.

8. The layer of claim 6, wherein the oxidant species are one or a plurality of anions capable of giving oxidation.

9. The layer of claim 7, wherein the monovalent cation is selected from the group consisting of tris(p-nitrophenyl)aminium, tris(2,4-dibromophenyl)aminium, tris(p-cyanophenyl)aminium, tris(p-bromophenyl)aminium, tris(p-butylphenyl)aminium), tris(p-methoxyphenyl)aminium, thianthrenium, nitrosonium, nitronium, and a combination thereof.

10. The layer of claim 6, wherein the bonded anions are selected from the group consisting of sulfonate, fluoroalkylsulfonate, carboxylate, fluoroalkylcarboxylate, phosphonate, phosphate, sulfate, and a combination thereof.

11. The layer of claim 6, wherein the polymer or oligomer is provided with substrate-binding groups.

12. A method of fabricating the layer of claim 6, the method comprising depositing the molecularly-thin layer of polymer or oligomer with bonded anions and a first counter-cation, followed by exchange of the first counter-cation with the oxidant cation.

13. A method of fabricating the device of claim 1, the method comprising:
    depositing the patterned source-drain electrode layers,
    depositing a molecularly-thin oxidant-containing layer,
    depositing the semiconductor layers,
    depositing the gate dielectric layers, and
    depositing the patterned gate electrode layers, in a sequence for the device configuration,
    wherein:
    the molecularly-thin oxidant-containing layer comprising bonded anions and oxidant species;
    the bonded anions are attached to a polymer or an oligomer backbone;
    the oxidant species are low molecular weight species have a standard electrode potential greater than or equal to 0.5 V vs the standard hydrogen electrode in the solvent they are applied; and
    the layer capable of p-doping an adjacent semiconductor layer to give ohmic hole-injection into or ohmic hole-extraction from the semiconductor.

14. An electronic circuit, comprising the device of claim 1.

* * * * *